United States Patent
Huh et al.

(10) Patent No.: US 9,299,954 B2
(45) Date of Patent: Mar. 29, 2016

(54) ORGANIC LIGHT-EMITTING APPARATUS AND METHOD OF MANUFACTURING THE SAME

(71) Applicant: Samsung Display Co., Ltd., Yongin (KR)

(72) Inventors: Myung-Soo Huh, Yongin (KR); Jae-Hyun Kim, Yongin (KR); Jin-Kwang Kim, Yongin (KR); Cheol-Lae Roh, Yongin (KR); Suk-Won Jung, Yongin (KR); Cheol-Min Jang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/331,846

(22) Filed: Jul. 15, 2014

(65) Prior Publication Data

US 2015/0108443 A1    Apr. 23, 2015

(30) Foreign Application Priority Data

Oct. 17, 2013    (KR) .......................... 10-2013-0124142

(51) Int. Cl.
  *H01J 9/26*    (2006.01)
  *H01J 9/32*    (2006.01)
  *H01L 51/52*    (2006.01)

(52) U.S. Cl.
  CPC ........ *H01L 51/5256* (2013.01); *H01L 51/5253* (2013.01)

(58) Field of Classification Search
  USPC ....................... 257/40, E27.119, E51.018, 88, 257/E23.002, E23.121, E51.026; 438/27, 438/26
  See application file for complete search history.

(56) References Cited

U.S. PATENT DOCUMENTS

| | | | |
|---|---|---|---|
| 7,148,106 B2* | 12/2006 | Joo et al. .................... | 438/257 |
| 8,569,951 B2* | 10/2013 | Ryu et al. .................... | 313/512 |
| 2003/0203210 A1 | 10/2003 | Graff et al. | |
| 2006/0216951 A1 | 9/2006 | Moro et al. | |
| 2008/0305360 A1 | 12/2008 | Han et al. | |
| 2012/0146492 A1* | 6/2012 | Ryu et al. .................... | 313/512 |
| 2013/0059155 A1 | 3/2013 | Choi et al. | |
| 2014/0242354 A1* | 8/2014 | Ro et al. .................... | 428/195.1 |

(Continued)

FOREIGN PATENT DOCUMENTS

| | | |
|---|---|---|
| JP | 2007-190844 | 8/2007 |
| KR | 10-0902706 | 6/2009 |
| KR | 10-1084267 | 11/2011 |

OTHER PUBLICATIONS

Yadong Zhang, et al., "Electroplating to visualize defects in Al2O3 thin films grown using atomic layer deposition," Thin Film Solids, Apr. 2, 2009, pp. 3169-3272, vol. 517, Issue 11, Elsevier B.V., available at http://www.sciencedirect.com/science/article/pii/S0040609009000133.

*Primary Examiner* — Telly Green

(74) *Attorney, Agent, or Firm* — H.C. Park & Associates, PLC

(57) ABSTRACT

An organic light-emitting apparatus including: a substrate; an organic light-emitting device disposed on the substrate and including a first electrode, a second electrode, and an intermediate layer disposed between the first electrode and the second electrode; and an encapsulation layer provided to cover the organic light-emitting device. The encapsulation layer includes a first inorganic layer including a first fracture point, and a first fracture control layer provided on the first inorganic layer to seal the first fracture point.

10 Claims, 8 Drawing Sheets

(56) References Cited

U.S. PATENT DOCUMENTS

2015/0034916 A1* 2/2015 Lee .................... H01L 51/5253 257/40

2015/0048329 A1* 2/2015 Kim ................................ 257/40
2015/0108442 A1* 4/2015 Kim .................... H01L 51/5253 257/40

* cited by examiner

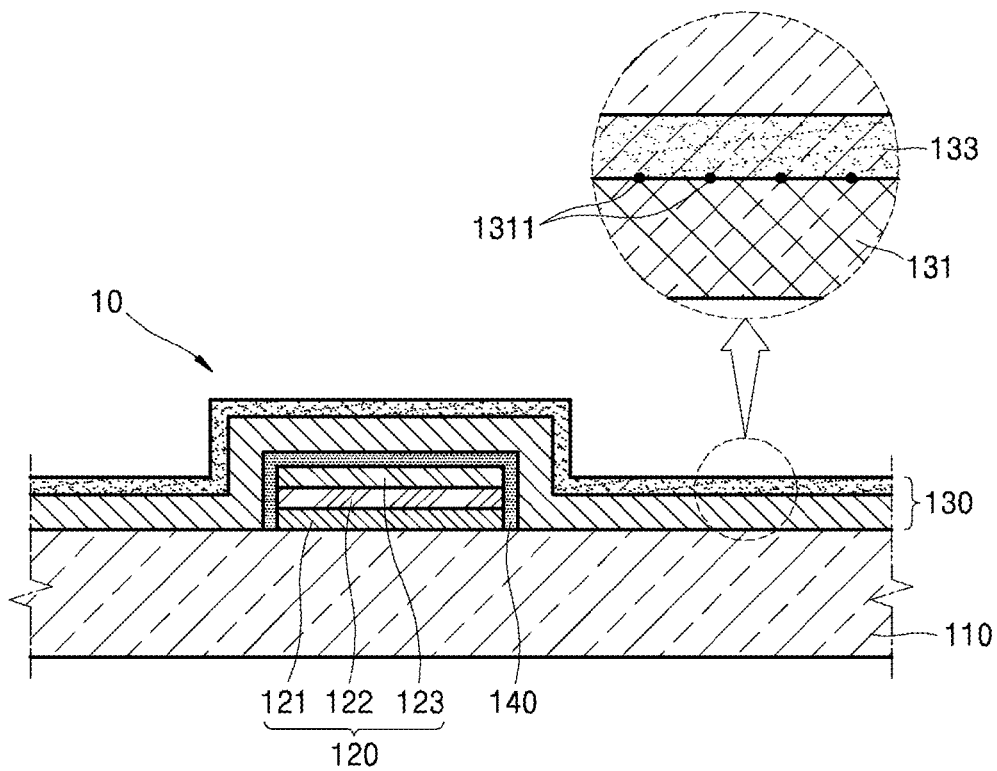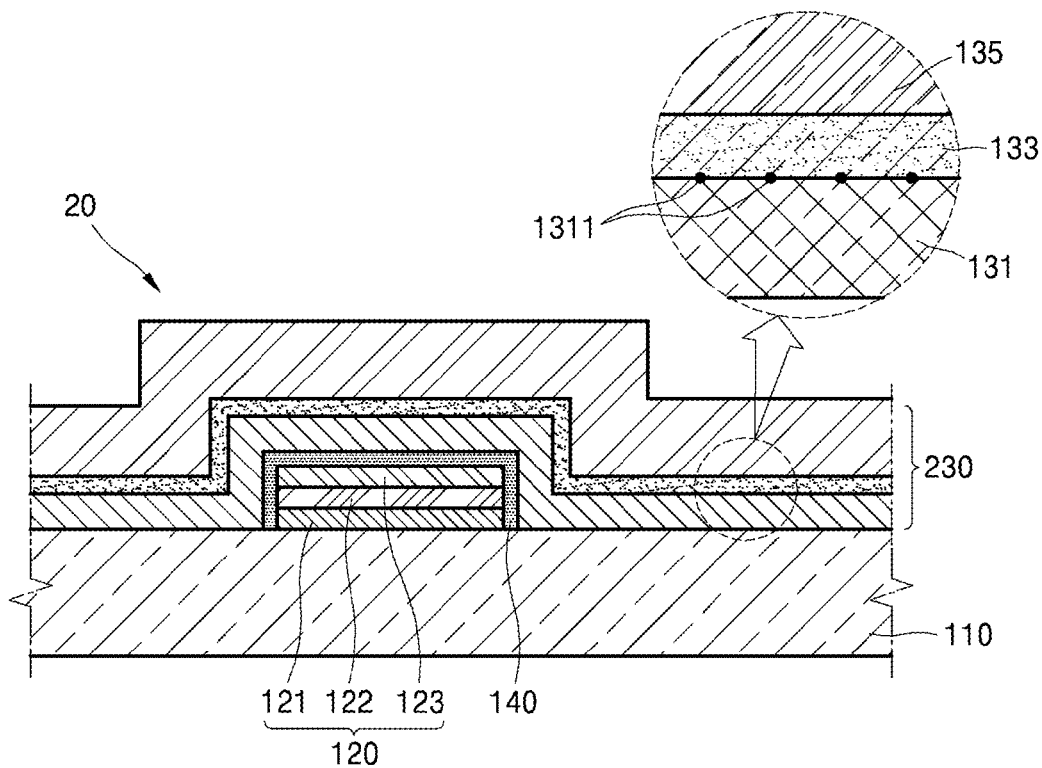

ORGANIC LIGHT-EMITTING APPARATUS AND METHOD OF MANUFACTURING THE SAME

CROSS-REFERENCE TO RELATED APPLICATION

This application claims priority from and the benefit of Korean Patent Application No. 10-2013-0124142, filed on Oct. 17, 2013, which is hereby incorporated by reference for all purposes as if fully set forth herein.

BACKGROUND

1. Field

Exemplary embodiments of the present invention relate to organic light-emitting apparatuses, and methods of manufacturing the same.

2. Discussion of the Background

An organic light-emitting apparatus may include an organic layer, an inorganic layer, and an intermixing region disposed at an interface between the organic layer and the inorganic layer. An organic material constitutes the organic layer and an inorganic material constitutes the inorganic layer. Because an encapsulation layer of the organic light-emitting apparatus has excellent oxygen-proof and moisture-proof characteristics, and may be formed as an ultrathin film, the organic light-emitting apparatus may have a long life and high brightness. The method of manufacturing the organic light-emitting apparatus is simple, and the manufacturing cost thereof may accordingly be reduced.

An organic light-emitting device is a self-luminous display device that emits light by electrically exciting a fluorescent organic compound. Because the organic light-emitting device may be driven at a low voltage, can easily be made very thin, has a wide viewing angle, and has a fast response speed, it is generally regarded as a next-generation display device that may solve many of the problems of a liquid crystal display (LCD) device. The organic light-emitting device includes an intermediate layer that is disposed between an anode electrode and a cathode electrode, and is formed of an organic material. When a positive voltage and a negative voltage are applied respectively to the anode electrode and the cathode electrode of the organic light-emitting device, holes injected from the anode electrode move to the intermediate layer via a hole transport layer, electrons move to the intermediate layer via an electron transport layer, and the electrons and the holes are recombined at the intermediate layer to generate excitons.

When the excitons change from an excited state to a base state, fluorescent molecules of the intermediate layer emit light, thereby forming an image. A full-color organic light-emitting device implements full colors by using pixels that emit three colors of red (R), green (G), and blue (B).

As described above, the organic light-emitting device includes the cathode electrode contacting the organic layer. In order to improve the reliability of the organic light-emitting device, there is a need to provide the organic light-emitting device with improved protection from moisture and oxygen permeation.

The above information disclosed in this Background section is only for enhancement of understanding of the background of the invention and, therefore, it may contain information that does not form the prior art that is already known in this country to a person of ordinary skill in the art.

SUMMARY

Exemplary embodiments of the present invention provide organic light-emitting apparatuses and methods of manufacturing the same.

Additional aspects will be set forth in part in the description which follows and, in part, will be apparent from the description, or may be learned by practice of the invention.

An exemplary embodiment of the present invention discloses an organic light-emitting apparatus including: a substrate; an organic light-emitting device disposed on the substrate and including a first electrode, a second electrode, and an intermediate layer disposed between the first electrode and the second electrode; and an encapsulation layer disposed to cover the organic light-emitting device. The encapsulation layer includes a first inorganic layer including a first fracture point, and a first fracture control layer disposed on the first inorganic layer and configured to seal a fracture generated at the first fracture point.

An exemplary embodiment of the present invention also discloses a method of manufacturing an organic light-emitting apparatus, the method including: forming an organic light-emitting apparatus on a substrate, the organic light-emitting device including a first electrode, a second electrode, and an intermediate layer disposed between the first electrode and the second electrode; and forming an encapsulation layer covering the organic light-emitting device. The forming of the encapsulation layer includes: forming a first inorganic layer covering the organic light-emitting device; and forming a first fracture control layer on the first inorganic layer to seal a first fracture point formed at a surface of the first inorganic layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

FIG. 1 is a cross-sectional view of an organic light-emitting apparatus according to an exemplary embodiment of the present invention.

FIG. 2 is a cross-sectional view of an organic light-emitting apparatus according to an exemplary embodiment of the present invention.

DETAILED DESCRIPTION OF THE ILLUSTRATED EMBODIMENTS

Figure 3:
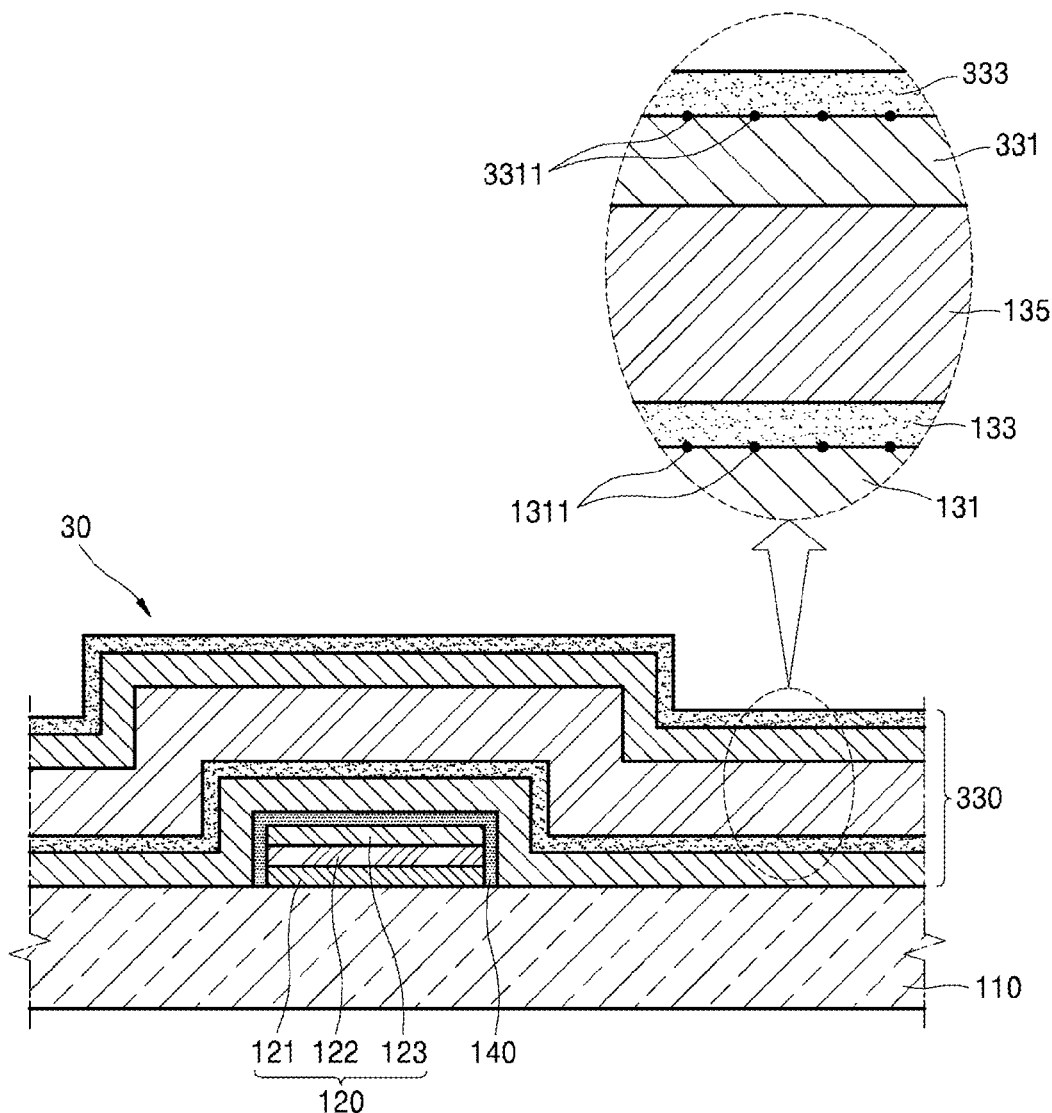
FIG. 3 is a cross-sectional view of an organic light-emitting apparatus according to an exemplary embodiment of the present invention.

The present invention will be described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements. As used herein, expressions such as "at least one of" when preceding a list of elements, modify the entire list of elements and do not modify the individual elements of the list.

It will be understood that although the terms "first", "second", etc. may be used herein to describe various components, these components should not be limited by these terms. These terms are only used to distinguish one component from another.

As used herein, the singular forms "a", "an" and "the" are intended to include the plural forms as well, unless the context clearly indicates otherwise.

It will be further understood that the terms "comprise", "include" and "have" used herein specify the presence of stated features or components, but do not preclude the presence or addition of one or more other features or components.

It will be understood that when an element or layer is referred to as being "on", "connected to", or "coupled to" another element or layer, it can be directly on, directly connected to, or directly coupled to the other element or layer, or intervening elements or layers may be present. In contrast, when an element is referred to as being "directly on," "directly connected to", or "directly coupled to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Hereinafter, exemplary embodiments of the present invention will be described in detail with reference to the accompanying drawings.

FIG. 1 is a cross-sectional view of an organic light-emitting apparatus 10 according to an exemplary embodiment of the present invention. Referring to FIG. 1, the organic light-emitting apparatus 10 includes an organic light-emitting device 120 disposed on a substrate 110, the organic light-emitting device 120 including a first electrode 121, an intermediate layer 122, and a second electrode 123. The organic light-emitting apparatus 10 also includes an encapsulation layer 130 covering the organic light-emitting device 120. The encapsulation layer 130 has a structure in which at least a first inorganic layer 131 and a first fracture control layer 133 are sequentially stacked. The first fracture control layer 133 is provided to seal a fracture generated at a first fracture point 1311 formed at a surface of the first inorganic layer 131.

The substrate 110 may be a substrate that is used in a general organic light-emitting device. For example, the substrate 110 may be a glass substrate or a plastic substrate having excellent mechanical strength, thermal stability, transparency, and surface smoothness, as well as being easy to handle and waterproof. Although not illustrated in FIG. 1, a planarization layer and an insulating layer may be further provided on the substrate 110.

The organic light-emitting device 120 is disposed on the substrate 110. The organic light-emitting device 120 includes the first electrode 121, the intermediate layer 122, and the second electrode 123.

The first electrode 121 may be formed by vacuum deposition or sputtering, and may be a cathode or an anode. The first electrode 121 may be a transparent electrode, a semi-transparent electrode, or a reflective electrode, and may be formed of indium tin oxide (ITO), indium zinc oxide (IZO), tin oxide ($SnO_2$), zinc oxide (ZnO), aluminum (Al), silver (Ag), or magnesium (Mg), although the present invention is not limited thereto. Also, as an example of various modifications, the first electrode 121 may have a multi-layered structure using two or more different materials.

The second electrode 123 may be formed by vacuum deposition or sputtering, and may be a cathode or an anode. The second electrode 123 may be formed of a metal having a low work function, an alloy, a conductive compound, or a mixture thereof. For example, the second electrode 123 may be formed of lithium (Li), magnesium (Mg), aluminum (Al), aluminum-lithium (Al—Li), calcium (Ca), magnesium-indium (Mg—In), or magnesium-silver (Mg—Ag). The second electrode 123 may have a multi-layered structure using two or more different materials.

The intermediate layer 122 is provided between the first electrode 121 and the second electrode 123. The intermediate layer 122 includes an organic emission layer. As another example, the intermediate layer 122 includes an organic emission layer and may further include at least one of a hole injection layer (HIL), a hole transport layer (HTL), an electron transport layer (ETL), and an electron injection layer (EIL) However, the present invention is not limited thereto, and the intermediate layer 122 may include an organic emission layer and other various functional layers.

A protection layer 140 may be further disposed on the organic light-emitting device 120. The protection layer 140 may be formed of an organic material or an inorganic material that may prevent the second electrode 123 of the organic light-emitting device 120 from being oxidized by moisture and oxygen. Also, the protection layer 140 may be formed of a compound of an organic material and an inorganic material.

Referring to FIG. 1, the encapsulation layer 130 is provided to cover the organic light-emitting device 120, and includes the first inorganic layer 131 and the first fracture control layer 133.

The first inorganic layer 131 may include $SiN_x$, $SiO_x$, $SiC_xN_y$, or $SiO_xN_y$. The first inorganic layer 131 includes the first fracture point 1311. The first fracture point 1311 is formed at the surface of the first inorganic layer 131. A plurality of first fracture points 1311 may be formed.

The first fracture control layer 133 is formed on the first inorganic layer 131. The first fracture control layer 133 may prevent a fracture from growing in the first inorganic layer 131. The first fracture control layer 133 may include an oxide, a nitride, an oxynitride, a metal, or a cermet. The first fracture control layer 133 may include $AlO_x$, $HfO_x$, $ZrO_x$, or $ZnO_x$.

The first fracture control layer 133 may be formed to have a relatively low density. When the density of the first fracture control layer 133 is greater than about 2.9 $g/cm^3$, a fracture may be formed in the first fracture control layer 133. The density of the first fracture control layer 133 may be in a range of about 2.6 $g/cm^3$ to about 2.9 $g/cm^3$.

When the first fracture control layer 133 is formed by atomic layer deposition (ALD), the first fracture control layer 133 may include carbon. A process in which carbon is included in the first fracture control layer 133 will be described later in a description of a method of manufacturing an organic light-emitting apparatus according to exemplary embodiments of the present invention. The density of the first fracture control layer 133 may depend on the carbon content of the first fracture control layer 133. When the first fracture control layer 133 is formed of $AlO_x$ and the carbon content of the first fracture control layer 133 is in a range of about 0.5% to about 1.5%, the density of the first fracture control layer 133 is in a range of about 3.1 $g/cm^3$ to about 3.3 $g/cm^3$. When the carbon content of the first fracture control layer 133 is in a range of about 3.8% to about 6.2%, the density of the first fracture control layer 133 is in a range of about 2.7 g/cm³ to about 2.9 g/cm³. Thus, by making the carbon content of the first fracture control layer 133 be within a range of about 2% to about 6%, the density of the first fracture control layer 133 may be within a range of about 2.6 g/cm³ to about 2.9 g/cm³. By controlling the carbon content of the first fracture control layer 133, the density of the first fracture control layer 133 may be reduced. Accordingly, fracture formation in the first fracture control layer 133 may be reduced, and the first fracture point 1311 of the first inorganic layer 131 may be sealed.

When the first fracture control layer 133 is formed to have a density of about 2.9 g/cm³ or less, the density of the first fracture control layer 133 may be maintained within a range of about 2.7 g/cm³ to about 2.9 g/cm³ even when the thickness of the first fracture control layer 133 is changed by about 5 nm to about 50 nm. Thus, in a low-density process, the density of the first fracture control layer 133 is not affected even when the thickness of the first fracture control layer 133 is changed. The thickness of the first fracture control layer 133 may be in a range of about 0.3 nm to about 5 nm. When the thickness of the first fracture control layer 133 is about 5 nm or less, the first fracture control layer 133 may more effectively seal the first fracture point 1311.

In general, the first inorganic layer 131 may be formed by chemical vapor deposition (CVD) or sputtering. When the first inorganic layer 131 is formed by CVD or sputtering, fracture points may be formed throughout the surface of the first inorganic layer 131, and a fracture may gradually grow from each fracture point. Accordingly, when the first inorganic layer 131 is formed by CVD or sputtering, fractures may exist throughout the first inorganic layer 131. Accordingly, the barrier characteristics of the first inorganic layer 133 may be degraded. An organic layer may be formed on the first inorganic layer 131. The organic layer may be formed of a polymer organic compound, and gas may be discharged when forming the polymer organic compound (outgassing). The discharged gas may permeate toward the organic light-emitting device 120. In this case, because the gas generated from the polymer organic compound may be concentrated on a fracture generated in the first inorganic layer 131, the second electrode 123 of the organic light-emitting device 120 may be oxidized, thus causing a dark spot.

According to the present exemplary embodiment, because the first fracture control layer 133 is formed on the first inorganic layer 131, the first fracture point 1311 at the surface of the first inorganic layer 131 may be sealed, and a defect in the surface of the first inorganic layer 131 may be removed. Also, because the first fracture point 1311 at the surface of the first inorganic layer 131 is sealed by the first fracture control layer 133, the growth of the fracture from the first fracture point 1311 may be prevented. Because the fracture formed in the first inorganic layer 131 may be reduced by the first fracture control layer 133, the barrier characteristics of the encapsulation layer 130 may be improved. Also, when the organic layer is formed on the first inorganic layer 131, the concentration of the gas on the fracture of the first inorganic layer 131 may be reduced and, thus, the generation of a dark spot may be reduced.

FIG. 2 is a cross-sectional view of an organic light-emitting apparatus 20 according to another exemplary embodiment of the present invention, which will be described by focusing on the differences between this exemplary embodiment and the exemplary embodiment of FIG. 1.

Referring to FIG. 2, the organic light-emitting apparatus 20 includes an organic light-emitting device 120 disposed on a substrate 110. The organic light-emitting device 120 includes a first electrode 121, an intermediate layer 122, and a second electrode 123. An encapsulation layer 230 covers the organic light-emitting device 120. The encapsulation layer 230 has a structure in which at least a first inorganic layer 131, a first fracture control layer 133, and a first organic layer 135 are sequentially stacked. The first fracture control layer 133 is provided to seal a first fracture point 1311 formed at a surface of the first inorganic layer 131.

The first organic layer 135 may include at least one material selected from acryl-based resin, methacryl-based resin, polyisoprene-based resin, vinyl-based resin, epoxy-based resin, urethane-based resin, cellulose-based resin, and parylene-based resin.

Because the first fracture point 1311 formed at the surface of the first inorganic layer 131 is sealed by the first fracture control layer 133, growth of the fracture formed in the first inorganic layer 131 may be reduced. Accordingly, the barrier characteristics of the encapsulation layer 230 may be improved. Also, because the concentration of the outgas generated from the first organic layer 135 on the fracture of the first inorganic layer 131 may be reduced, the generation of a dark spot may be reduced.

FIG. 3 is a cross-sectional view of an organic light-emitting apparatus 30 according to another exemplary embodiment of the present invention, which will be described by focusing on the differences between this exemplary embodiment and the exemplary embodiment of FIG. 2.

Referring to FIG. 3, the organic light-emitting apparatus 30 includes an organic light-emitting device 120 disposed on a substrate 110. The organic light-emitting device 120 includes a first electrode 121, an intermediate layer 122, and a second electrode 123. The organic light-emitting apparatus 30 includes an encapsulation layer 330 covering the organic light-emitting device 120. The encapsulation layer 330 has a structure in which at least a first inorganic layer 131, a first fracture control layer 133, a first organic layer 135, a second inorganic layer 331, and a second fracture control layer 333 are sequentially stacked. The first fracture control layer 133 is provided to seal a first fracture point 1311 formed at a surface of the first inorganic layer 131. The second fracture control layer 333 is provided to seal a second fracture point 3311 formed at a surface of the second inorganic layer 331.

The second inorganic layer 331 and the second fracture control layer 333 are substantially identical to the first inorganic layer 131 and the first fracture control layer 133.

Because the first fracture point 1311 formed at the surface of the first inorganic layer 131 is sealed by the first fracture control layer 133, growth of the fracture formed in the first inorganic layer 131 may be reduced. Because the second fracture point 3311 formed at the surface of the second inorganic layer 331 is sealed by the second fracture control layer 333, the growth of the fracture formed in the second inorganic layer 331 may be reduced. Accordingly, the barrier characteristics of the encapsulation layer 330 may be improved. Also, because the concentration of the outgas generated from the first organic layer 135 on the fracture of the first inorganic layer 131 may be reduced, the generation of a dark spot may be reduced.

The encapsulation layer 330 may further include a plurality of additional inorganic layers and organic layers that are alternately disposed, and may further include fracture control layers formed on the inorganic layers. The number of stacked inorganic layers, fracture control layers, and organic layers is not limited.

FIGS. 4A to 4D are schematic cross-sectional views illustrating a method of manufacturing the organic light-emitting apparatus 10 of FIG. 1, according to an exemplary embodiment of the present invention.

Figure 4A:
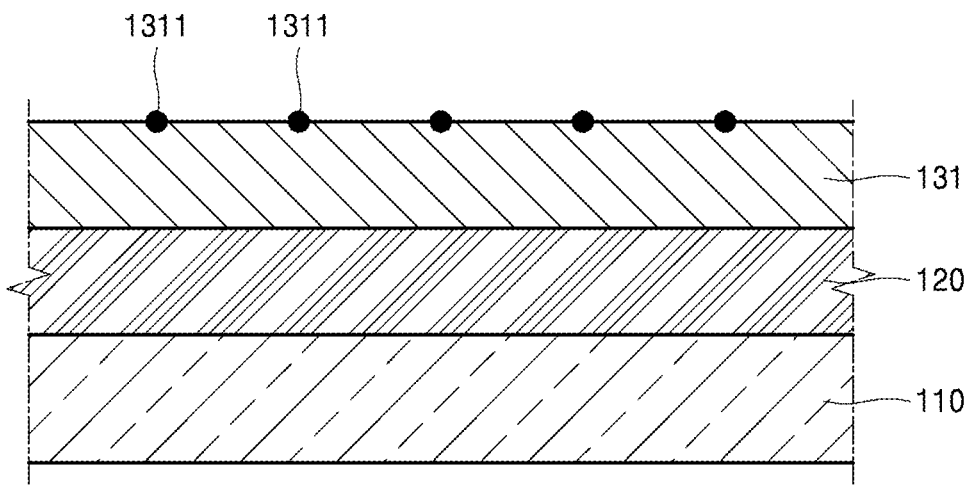
FIGS. 4A to 4D are schematic cross-sectional views illustrating a method of manufacturing the organic light-emitting apparatus of FIG. 1, according to an exemplary embodiment of the present invention.

Referring to FIG. 4A, an organic light-emitting device 120 and a first inorganic layer 131 are formed on a substrate 110. The first inorganic layer 131 may be formed by CVD or sputtering. A first fracture point 1311 from which a fracture may grow may be formed at a surface of the first inorganic layer 131.

Figure 4B:
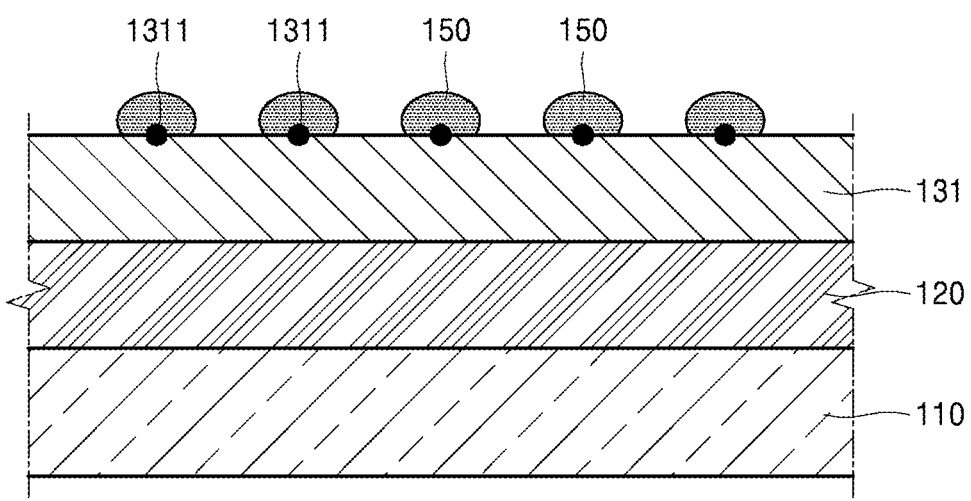

Thereafter, an adsorption operation of an ALD process may be performed as illustrated in FIG. 4B. The ALD process is a process of adsorbing a layer at a 1-monolayer level by physical adsorption. Referring to FIG. 4B, a source material 150 may be adsorbed at the first fracture point 1311. The source material 150 may be adsorbed at the first fracture point 1311 that is most unstable in energy on the first inorganic layer 131. Because the source material 150 may be adsorbed at the first fracture point 1311 of the first inorganic layer 131, the first fracture point 1311 may be sealed. The source material 150 may be trimethylaluminum (TMA).

Figure 4C:
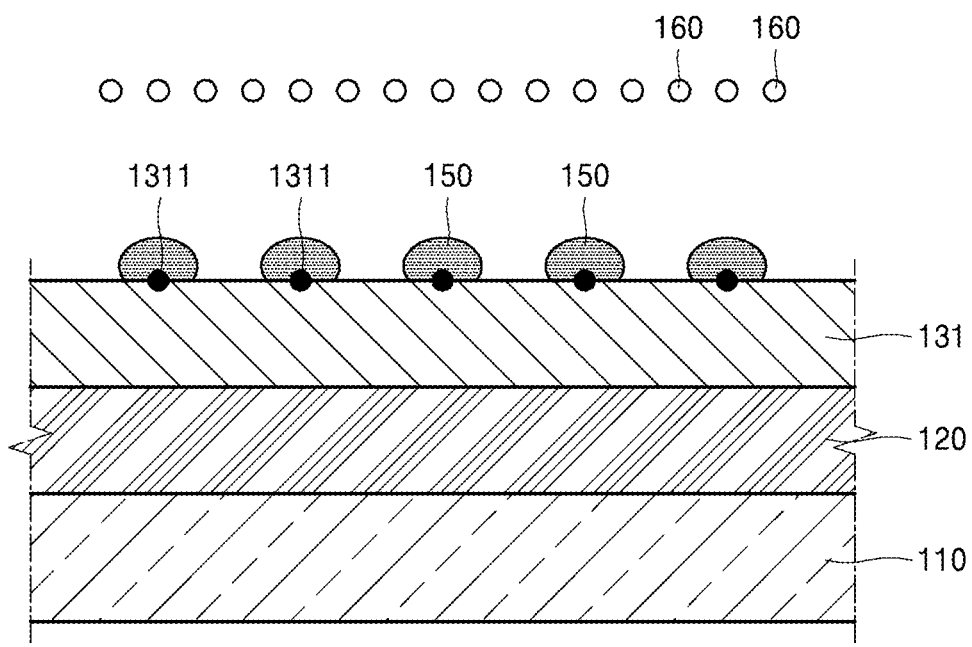
Figure 4D:
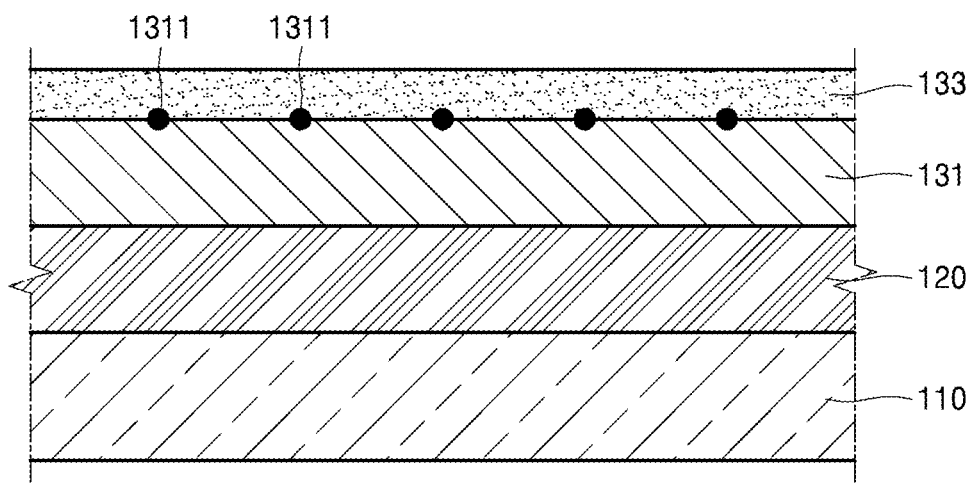

Thereafter, a reaction operation of the ALD process may be performed as illustrated in FIG. 4C. Referring to FIG. 4C, a reactive material 160 may be supplied. Because the source material 150 reacts with the reactive material 160, a first fracture control layer 133 may be formed, as illustrated in FIG. 4D. When the reactive material 160 is supplied, plasma, heat, or ultraviolet radiation may be applied as an energy source. The reactive material 160 may be active oxygen. When the source material 150 is TMA and the reactive material 160 is active oxygen, the TMA may react to the active oxygen, and, as a result, an $AlO_x$ layer may be formed as the first fracture control layer 133. In this case, because the carbon included in the TMA is unstably combined with the $AlO_x$, the first fracture control layer 133 may include carbon. Because the carbon is unstably combined with the $AlO_x$, as the plasma, heat, or ultraviolet radiation that is the energy source is increased, the unstably-combined carbon may be separated from the $AlO_x$ by reacting to the active carbon. Accordingly, the carbon content of the first fracture control layer 133 may be reduced. By controlling the energy source in the reaction operation, the carbon content of the first fracture control layer 133 may be controlled. By controlling the carbon content of the first fracture control layer 133, the density of the first fracture control layer 133 may be controlled.

When the first fracture control layer 133 is formed of $AlO_x$, and the carbon content of the first fracture control layer 133 is in a range of about 3.8% to about 6.2%, the density of the first fracture control layer 133 is about 2.7 $g/cm^3$ to about 2.9 $g/cm^3$. Thus, by making the carbon content of the first fracture control layer 133 be within a range of about 2% to about 6%, the density of the first fracture control layer 133 may be within about 2.6 $g/cm^3$ to about 2.9 $g/cm^3$. By controlling the carbon content of the first fracture control layer 133, the density of the first fracture control layer 133 may be reduced. Accordingly, the formation of a fracture in the first fracture control layer 133 may be reduced, and the first fracture point 1311 of the first inorganic layer 131 may be sealed.

An exhaustion operation may be performed between the adsorption operation and the reaction operation of the ALD process. The ALD process may include an adsorption operation, a first exhaustion operation, a reaction operation, and a second exhaustion operation. One layer of source material may be accumulated through the first exhaustion operation, and materials other than the first fracture control layer 133 may be removed through the second exhaustion operation. The ALD process may be performed as a cycling process of the above four operations.

Figure 5A:
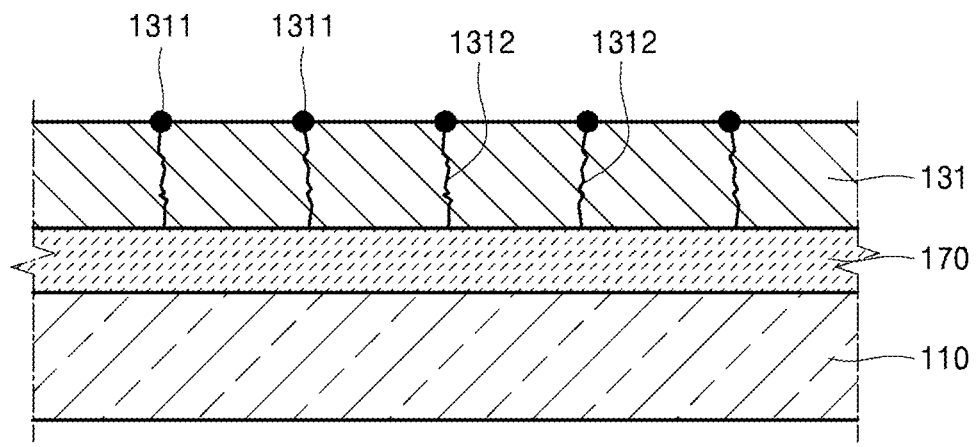
FIGS. 5A to 5C are diagrams illustrating problems of the related art according to a comparative example.
Figure 5B:
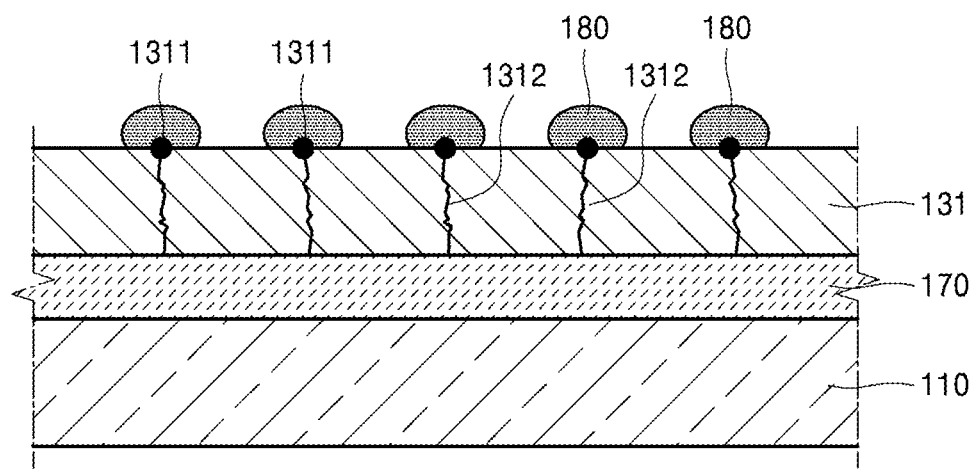
Figure 5C:
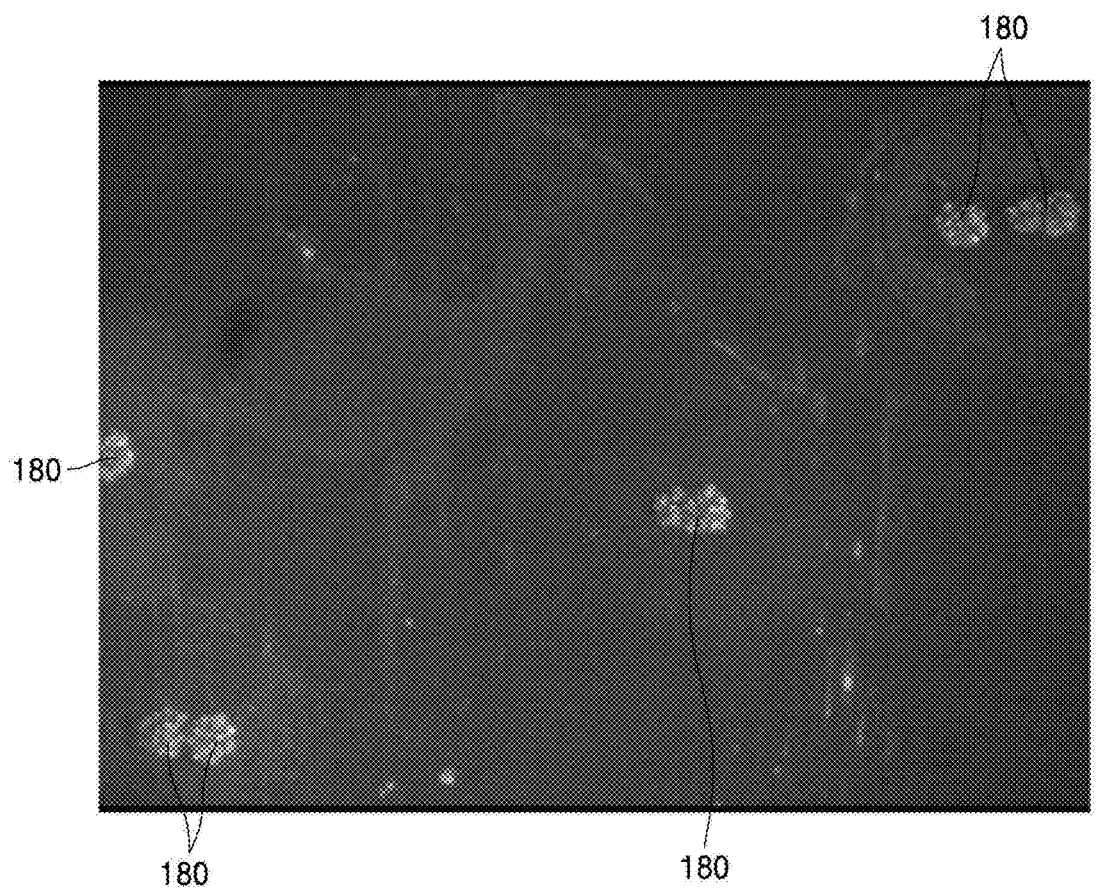

FIGS. 5A to 5C are diagrams illustrating problems of the related art according to a comparative example.

Referring to FIG. 5A, a metal layer 170 is formed on a substrate 110, and a first inorganic layer 131 is formed on the metal layer 170. A first fracture point 1311 is formed at a surface of the first inorganic layer 131, and a first fracture 1312 is grown from the first fracture point 1311.

Referring to FIG. 5B, a plating layer 180 may be formed on the first fracture point 1311 by electroplating. When the first fracture 1312 is formed in the first inorganic layer 131, the plating layer 180 is formed on the first fracture point 1311 as a result of the flow of ions through the first fracture 1312 in a plating solution. In this way, whether a fracture exists in the inorganic layer and the number of fractures may be detected.

FIG. 5C is a picture illustrating a situation in which Cu is formed as the plating layer 180 when the metal layer 170 is Al, the first inorganic layer 131 is $SN_x$, and Cu is electroplated. As illustrated in FIG. 5C, when only the first inorganic layer 131 is formed, a plurality of Cu plating layers 180 are formed on the first inorganic layer 131. Thus, when only the first inorganic layer 131 is formed, a plurality of first fractures 1312 may exist in the first inorganic layer 131 and, thus, the barrier characteristics of the encapsulation layer including the first inorganic layer 131 may be degraded.

Figure 6A:
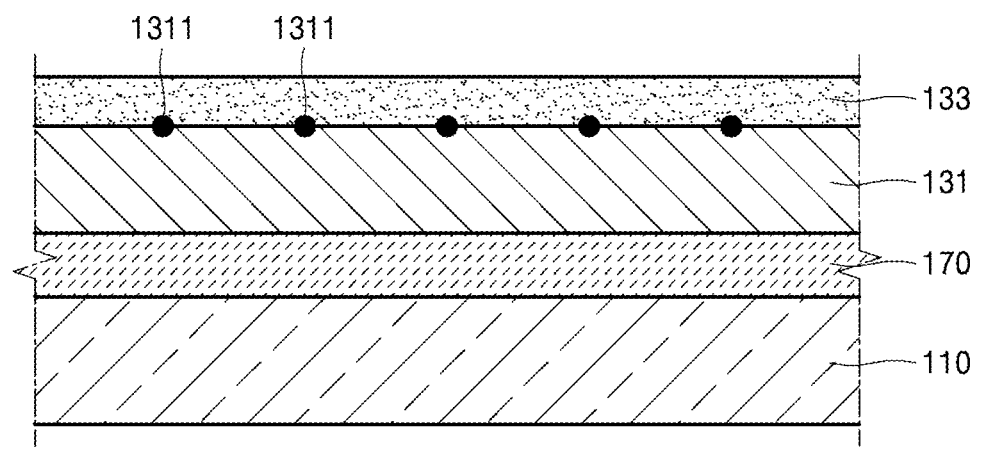
FIGS. 6A and 6B are diagrams illustrating effects according to exemplary embodiments of the present invention.

Referring to FIG. 6A, a metal layer 170 is formed on a substrate 110, and a first inorganic layer 131 and a first fracture control layer 133 are formed on the metal layer 170. The first inorganic layer 131 may include first fracture points 1311, and the first fracture control layer 133 may seal the first fracture points 1311.

Figure 6B:

FIG. 6B is a picture illustrating a situation in which Cu is formed as a plating layer 190 when the metal layer 170 is Al, the first inorganic layer 131 is $SN_x$, the first fracture control layer 133 is $AlO_x$, and Cu is electroplated. As illustrated in FIG. 6B, when the first fracture control layer 131 is formed on the first inorganic layer 131, the Cu plating layer 190 on the first inorganic layer 131 is significantly reduced. Thus, when the first fracture control layer 133 is formed on the first inorganic layer 131, the fracture formed in the first inorganic layer 131 may be significantly reduced and, thus, the barrier characteristics of the encapsulation layer including the first inorganic layer 131 and the first fracture control layer 133 may be improved. Also, when the organic layer is formed on the first inorganic layer 131, the concentration of the gas on the fracture of the first inorganic layer 131 may be reduced and, thus, the generation of a dark spot may be reduced.

As described above, according to the exemplary embodiments of the present invention, the barrier characteristics of the encapsulation layer in the organic light-emitting apparatuses may be improved.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing an organic light-emitting apparatus, comprising:

forming an organic light-emitting device on a substrate, the organic light-emitting device comprising:

a first electrode;

a second electrode; and an intermediate layer disposed between the first electrode and the second electrode; and forming an encapsulation layer to cover the organic light-emitting device, wherein:

the forming of the encapsulation layer comprises:

forming a first inorganic layer to cover the organic light-emitting device; and forming a first fracture control layer on the first inorganic layer to seal a first fracture point formed at a surface of the first inorganic layer; and at least a portion of the first fracture control layer overlaps the light-emitting device.

2. The method of claim 1, wherein the forming of the encapsulation layer further comprises forming a first organic layer on the first fracture control layer.

3. The method of claim 2, wherein the forming of the encapsulation layer further comprises:

forming a second inorganic layer on the first organic layer; and forming a second fracture control layer on the second inorganic layer to seal a second fracture point formed at a surface of the second inorganic layer.

4. The method of claim 1, wherein the first fracture control layer comprises an oxide, a nitride, an oxynitride, a metal, or a cermet.

5. The method of claim 1, wherein a density of the first fracture control layer is in a range of about 2.6 g/cm$^3$ to about 2.9 g/cm$^3$.

6. The method of claim 1, wherein a thickness of the first fracture control layer is in a range of about 0.3 nm to about 5 nm.

7. The method of claim 1, wherein the forming of the first fracture control layer comprises using an atomic layer deposition (ALD) process.

8. The method of claim 7, wherein the ALD process comprises:

an adsorption operation;

a first exhaustion operation;

a reaction operation; and a second exhaustion operation.

9. The method of claim 8, wherein a source material is adsorbed at the first fracture point during the adsorption operation.

10. The method of claim 8, wherein a carbon content of the first fracture control layer is controlled during the reaction operation.

* * * * *